United States Patent [19]

Suda et al.

[11] Patent Number: 5,418,749

[45] Date of Patent: May 23, 1995

[54] SEMICONDUCTOR MEMORY DEVICE

[75] Inventors: Kei Suda; Nobuo Furuya, both of Tokyo, Japan

[73] Assignee: NEC Corporation, Tokyo, Japan

[21] Appl. No.: 153,961

[22] Filed: Nov. 18, 1993

[30] Foreign Application Priority Data

Nov. 18, 1992 [JP] Japan ................... 4-332507

[51] Int. Cl.⁶ .............................................. G11C 7/00
[52] U.S. Cl. ....................................... 365/203; 365/190
[58] Field of Search ............... 365/203, 190, 207, 208, 365/205

[56] References Cited

U.S. PATENT DOCUMENTS

| | | | |
|---|---|---|---|
| 4,661,931 | 4/1987 | Flannagan et al. | 365/203 |
| 4,740,926 | 4/1988 | Takemae et al. | 365/203 |
| 4,802,129 | 1/1989 | Hoekstra et al. | 365/203 |

FOREIGN PATENT DOCUMENTS 2-44598  2/1990 Japan .
2-56799  2/1990 Japan .

*Primary Examiner*—Joseph A. Popek
*Attorney, Agent, or Firm*—Sughrue, Mion, Zinn, Macpeak & Seas

[57] ABSTRACT

A semiconductor memory device comprises a word lines (15), pairs of complementary data lines (17, 18), memory elements (MC11) respectively arranged at each intersection of the word lines and the pairs of complementary data lines, pairs of complementary signal lines (17s, 18s) each associated with a sense amplifiers (SA) and selectively connected to one of the pairs of complementary data lines via a pair of transfer gate transistors (7, 8), first precharge means (5, 6) for charging the pairs of complementary data lines and second precharge means (19, 20) for charging the pairs of complementary signal lines. The second precharge means charge the pairs of complementary signal lines to a first voltage ($V_D$), the first precharge means charge the pairs of complementary signal lines to a second voltage ($V_D$-$V_t$) which is smaller than the first voltage by a threshold voltage ($V_t$) of the transfer gate transistors and the transfer gate transistors have their gate electrodes supplied with the first voltage. The transfer gate transistors are N-channel type MOS transistors and the first and the second precharge means include N and P channel MOS type transistors respectively.

10 Claims, 7 Drawing Sheets

SEMICONDUCTOR MEMORY DEVICE

BACKGROUND OF THE INVENTION

This invention relates to a semiconductor memory device and, more particularly, to an random access MOS memory device of a static type performing a high speed operation with low power consumption.

In this type of semiconductor memory device, increase in the operating speed and reduction in the power consumption are required as basic important problems. However, in general, MOS transistors used in each memory cell, i.e. memory transistors, are formed in an as small size as possible for the sake of the integration density so that the load driving capacity of each memory transistor is extremely low, making it difficult to transfer the data quickly to a sense amplifier via a bit line pair. In particular, each bit line of the bit line pair has a large stray capacitance owing to a large number of memory cells being connected thereto so that the operation of sending the data in the memory elements to the sense amplifier via the bit line pair requires a very long time taking up the major part of the total time for access operation. Moreover, since each memory transistor is extremely small, the node voltages in the memory elements relative to the stored data are sensitive to voltages on the bit line pair. Therefore, it is needed to precharge the bit line pair to a certain voltage preceeding to the access operation in order to prevent the distribution of the stored data, causing a high current consumption.

Referring to FIG. 6, in a conventional semiconductor memory device, a memory cell MC11 includes CMOS type inverters 1, 2 whose input nodes and output nodes are mutually connected to each other and N-channel MOS transfer gate transistors 3, 4 having gate electrode connected to a word line 15. A pair of lines 17 and 18 are provided as a bit line pair. Although there are provided a plurality of the memory cells MC11, a plurality of the word lines 15 and a plural pairs of bit lines 17 and 18, only one set of them is shown in FIG. 6 for simplifying the explanation. That is, a memory cell MC11 as described in the above is provided at each intersection of these word lines 15 and the bit line pair 17 and 18. The bit lines 17, 18 are connected to a power supply line $V_D$ via N-channel type MOS precharge transistors 5, 6 respectively which have gate electrodes connected to a precharge control line 14. The bit lines 17, 18 are also selectively connected to data signal lines 17s, 18s via N-channel column selection gate transistors 7, 8 respectively, each of which has its gate electrode connected to a column selection signal line 23. A sense amplifier SA is provided to amplify the memory data transferred to the data lines 17s, 18s. This sense amplifier consists of a current mirror load circuit formed by P-channel type MOS transistors 11, 12 and N-channel type MOS transistors 9, 10 which have gate electrodes connected to the data lines 17s, 18s and amplify the memory data, and an N-channel type MOS transistor 13 as a current source. The read data is output from a node Nout which is a drain node of the transistor 10. The current source transistor 13 is connected to a sense amplifier control line 16 which selectively activates the sense amplifier SA. The data lines 17s, 18s are also precharged by precharge transistors 25, 26 which have gate electrodes connected to the precharge control line 14. The data lines 17s, 18s are further connected to write signal lines WBa, WBb via write gate transistors WGa, WGb respectively, the gates of these transistors being connected to a write control signal line WSW.

In this circuit, the bit lines 17, 18 and the data lines 17s, 18s are preliminary precharged to the voltage level of $V_D$-$V_t$, wherein the voltage $V_D$ and $V_t$ are the power source voltage of the device and the threshold voltage of the N-channel transistors 5, 6, 25, 26 respectively, according to a precharge signal PC on the precharge control line 14 during a first period. Then, in a second period, the precharge operation is completed and the sense amplifier SA is activated according to the control signal on the sense amplifier control line 16. Subsequently, the word line 15 and the column selection line 23 are selectively activated to connect the memory cell MC11 to the bit lines 17 and 18 and the data lines 17s, 18s via the column selection transistors 7, 8. Therefore, the voltage difference appears between the nodes 21, 22 in response to the data stored in the memory cell MC11. The data is amplified by the sense amplifier SA and output from the output node Nout. In this read operation, the write control signal on the control line WSW is at its low level to disconnect the data lines 17s, 18s from the write signal lines WBa, WBb.

In a write operation, on the other hand, the write control signal line WSW is changed to the high level so that the data lines 17s, 18s are connected to the write signal lines WBa, WBb, respectively, in the second period. As a result, the voltage level of one of the bit lines 17, 18 is decreased to the ground voltage VS according to write data so that the write data is written into the memory cell MC11.

FIG. 7 shows another example of conventional memory devices wherein parts equivalent to those in FIG. 6 are shown by identical symbols. This device utilizes P-channel transistors 5P, 6P, 25P, 26P as precharge means for precharging the bit lines 17, 18 and the data lines 17s, 18s up to a power supply voltage $V_D$. This device further includes P-channel gate transistors 7P, 8P additionally to the N-channel gate transistors 7, 8. The read and write operations of this device is nearly the same as the device of FIG. 6 except for the precharge voltage and the input voltage of the sense amplifier SA. That is, in this device, the bit lines 17, 18 and the data lines 17s, 18s are precharged to the power supply voltage $V_D$ so that the input voltages of the sense amplifier SA become the voltage $V_D$ and the lower voltage. Therefore, the sense amplifier SA can operate more efficiently than in case of FIG. 6 where the input voltages at nodes 21 and 22 are $V_D$-$V_t$ and the lower voltage.

In the device of FIG. 6, since only the N-channel type MOS transistors are used as the precharging transistors for precharging the bit and data lines, the precharge level of each line is at $V_D$-$V_t$, so that the voltage difference between the input nodes 21, 22 of the sense amplifier SA are comparatively low, making it difficult for the sense amplifier to sense the voltage difference quickly. In particular, when the memory device is supplied with the power voltage such as 3 V, since the threshold voltage of the N-channel transistors is usually about 1.5 V, the range of the input voltage levels of the sense amplifier is decreased to lower than 1.5 V. This voltage range markedly reduces the sensing ability of the sense amplifier to detect the potential difference on the complementary data lines and thereby increases the access time of the semiconductor memory circuit. Furthermore, when the memory device is required to operate under a lower power supply voltage such as 2.5 V, it is impossible for the sense amplifier to detect the input voltage difference.

In the device of FIG. 7, on the other hand, since the P-channel MOS transistors are used as the precharging transistors to precharge each of the bit and data lines up to the power supply voltage $V_D$, the aforementioned problem about the inability of the sense amplifier in the device of FIG. 6 will not arise; however, one of the complementary data lines goes from the precharging level $V_D$ (power supply level) to VS (ground level) whenever a read/write operation occurs, making the power consumption of the device large. In more detail, almost all part of the power consumption in the precharging operation is the amount of the charge itself which is supplied to the bit lines 17, 18 and the data lines 17s, 18s and this amount of the charge depends on the total capacitance consisting of the stray capacitances of the bit lines 17, 18 and the data lines 17s, 18s and the precharging voltage level. Therefore, by a comparison between the circuit of FIG. 7 in which the precharge level is set to be 3 V by using the P-channel type MOS transistors as a means for precharging, and the circuit of FIG. 6 in which the precharging level is set to be 1.5 V by using the N-channel MOS transistors for precharging, the memory device of FIG. 7 consumes the precharging power which is about twice as large as that of the device of FIG. 6.

Furthermore, in the device of FIG. 7, since the precharge voltage is so high as the power supply voltage, some amount of charges from the one of complementary data lines 17, 18 will flow into the memory nodes in the memory cell MC11, so that the voltage of the low level node is raised slightly and there may occur a rewrite or destruction of the memory data in the read operation. In more detail, this voltage raise at the low level node is substantially determined as a product of the precharge voltage of the complementary data lines and the ratio of the ON-resistances of the transfer transistor 3, 4 and an N-channel transistor which is used in the inverter 1 or 2. Therefore, the higher the bit lines are precharged, the higher the voltage of the low level node is raised, making it difficult to hold the memory data correctly and the keeping holding margin of the device small.

In order to reduce the power consumption, the Japanese Patent Laid-Open Publication No. Hei 2-56799 discloses a circuit configuration in which the MOS transistors corresponding to the transistors 3, 4 in memory cell MC11 in FIG. 6 and the MOS transistors corresponding to the transistors 5, 6 for precharging the bit lines 17, 18 in FIG. 6 are replaced by P-channel type MOS transistors and the voltage source for precharging is set at the ground level. In this device, the precharge level of the bit lines corresponding to the lines 17, 18 are the voltage $V_t$ so that the input voltages of the sense amplifier become the voltage $V_t$ and a more higher voltage. Therefore the sense amplifier itself can operate more efficiently than in a case of FIG. 6 where the input voltages are $V_D$-$V_t$ and at a lower voltage and, moreover, the power consumption of this device becomes small owing to the low precharge level. However, the driving capacity of the memory cells in semiconductor memories is very low as mentioned above and it is difficult for the memory cell to raise the voltage on the data lines quickly higher than the precharge voltage so that the high speed operation cannot be achieved in this device.

Another improvement in reduction in power consumption is disclosed in Japanese Patent Laid-Open Publication No. Hei 2-44598. In a memory device disclosed therein, the bit lines are precharged to the power supply voltage and the output signal of the sense amplifier is monitored to detect the completion of the sense amplifying operation to thereby stop activating the sense amplifier with temporarily latching the output of the sense amplifier. The word line is then deactivated and the complementary bit line pair is precharged. It becomes possible in this device to decrease the current which flows from the bit lines to the ground line via memory cells during the read operation and, additionally, cut down the current which flows in the sense amplifier even after the completion of sensing. Therefore, it is possible to reduce the power consumption of the precharging circuit during the read operation. However, in this device, since the bit lines are precharged to the power supply voltage, the voltages of the bit lines still change between the power supply voltage and the ground voltage. The reduction in power consumption is thereby restricted.

SUMMARY OF THE INVENTION

It is therefore an object of this invention to provide a semiconductor memory device which can operate at high speed with a further reduced power consumption.

It is another object of this invention to provide a memory device which operates at high speed with small power consumption even when a power source voltage is lowered.

A semiconductor memory device according to this invention comprises a plurality of word lines, a plurality of pairs of bit lines, a plurality of memory elements each arranged at one of intersections of the word lines and the pairs of bit lines, a pair of data lines each associated with a sense amplifier and selectively connected to one of the pairs of complementary data lines via pair of transfer gate transistors, a first precharge circuit for charging the pairs of bit lines, and a second precharge circuit for charging the pair of data lines, wherein the second precharge circuit charges the pair of data lines to a first voltage and the first precharge circuit charges the pairs of bit lines to a second voltage which is smaller than the first voltage.

The second voltage is preferably smaller than the first voltage by a threshold voltage of the transfer gate transistors. The transfer gate transistors have their gate electrodes is supplied, when selected with the first voltage. Favorably, each of the transfer gate transistors is of an N-channel type, and the first and the second precharge means include N-channel and P-channel MOS type transistors, respectively.

DETAILED DESCRIPTION OF THE PREFERRED EMBODIMENTS

Figure 1:
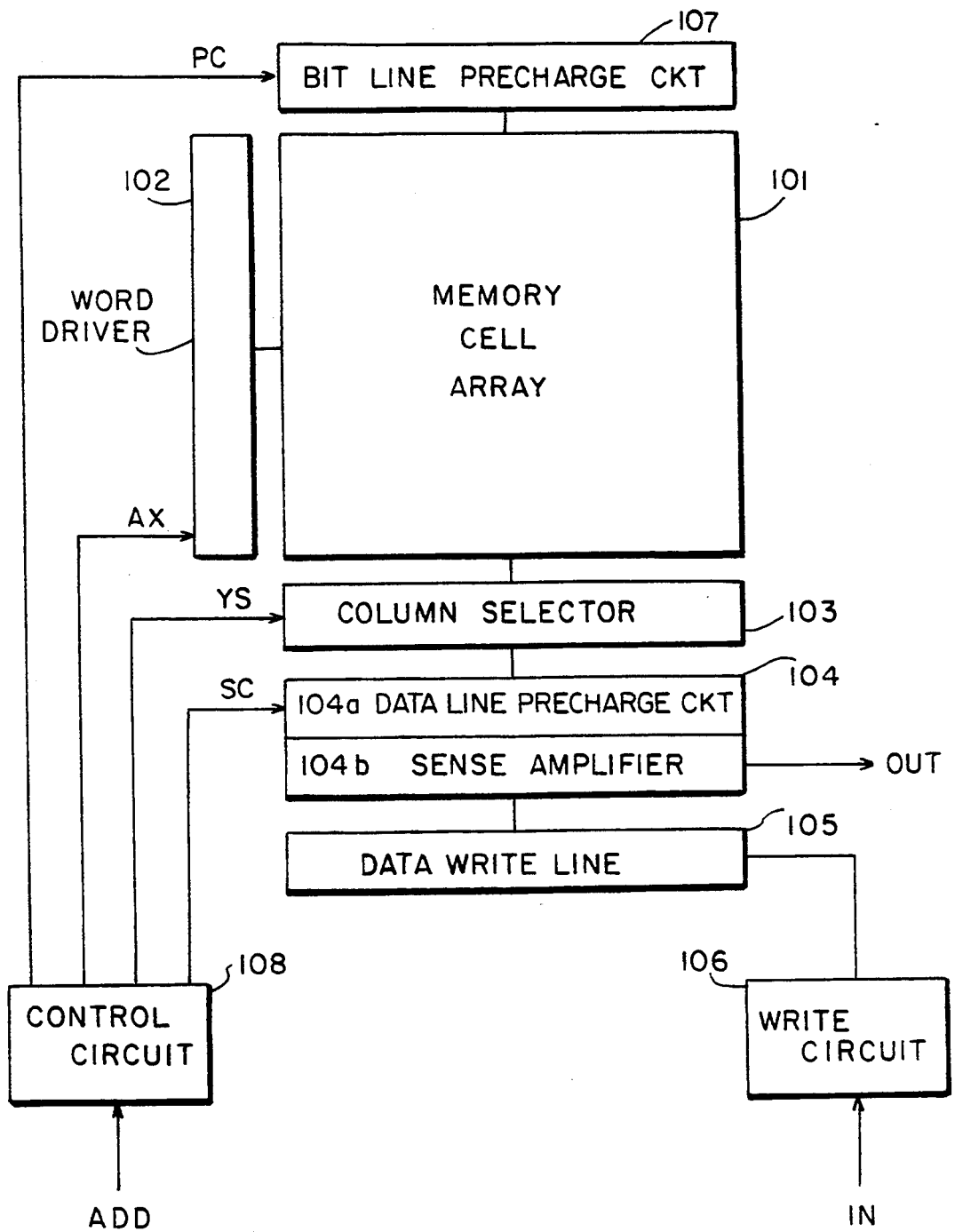
FIG. 1 is a block diagram of a memory device embodying the present invention.

Referring to FIG. 1, a memory device according to the present invention has a memory cell array 101, a word driver 102, a column selector 103, a bit line precharge circuit 107 and a sensing circuit 104 which comprises a sense amplifier portion 104b and a sense amplifier precharge circuit 104a. The device also comprises a write data bus line region 105, a write circuit 106 and a control circuit 108 supplied with a set of address signals Add and control signals (not shown) and outputting a precharge control signal PC to the bit line precharge circuit 107, a sensing control signal SC to the sensing circuit 104, the drive control signals Ax to the word driver 102 and selection control signals YS to the column selector 103, respectively.

Figure 2:
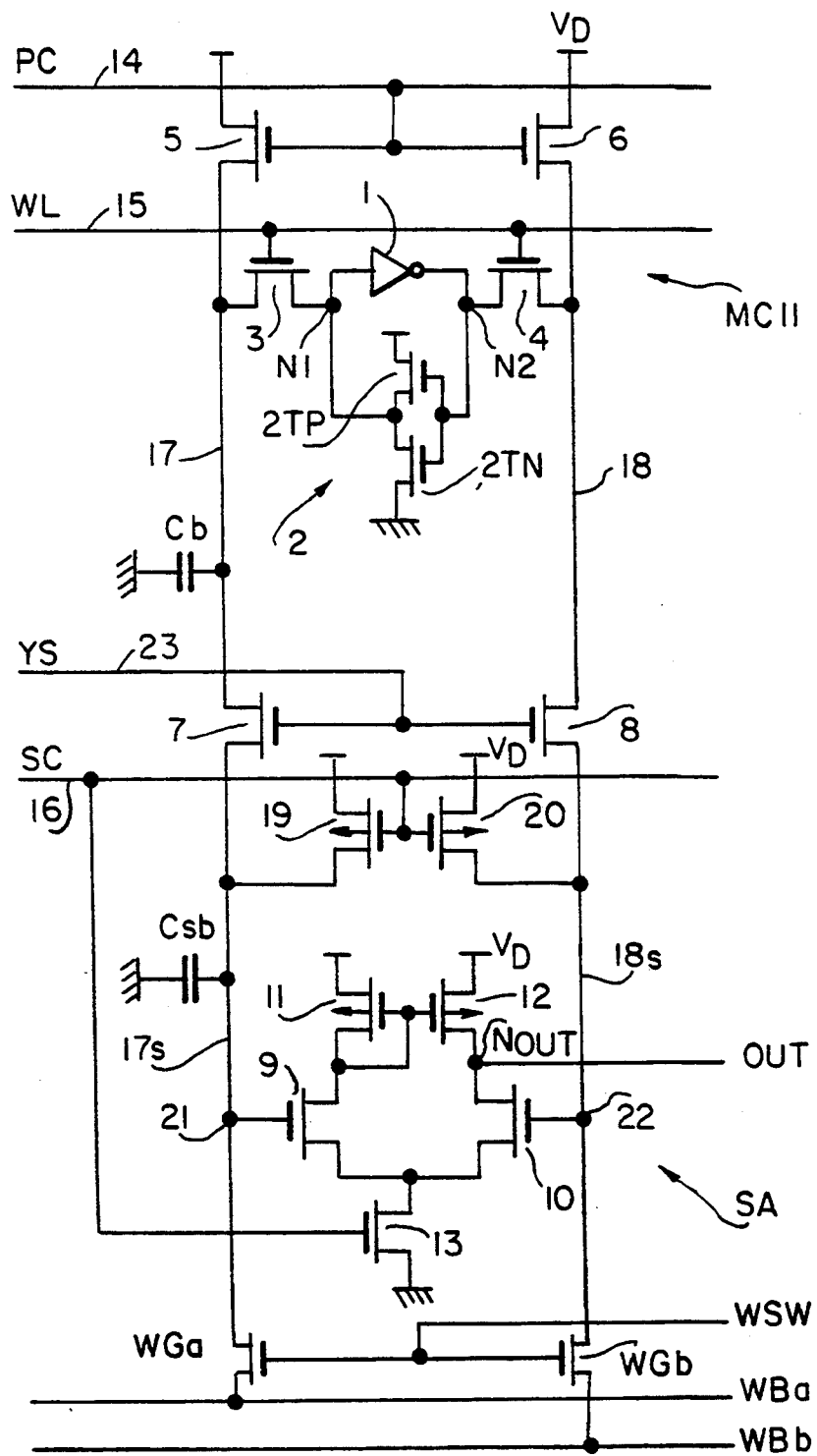
FIG. 2 shows a circuit configuration of the important part of the device shown in FIG. 1 according to an embodiment of the invention.
Figure 6:
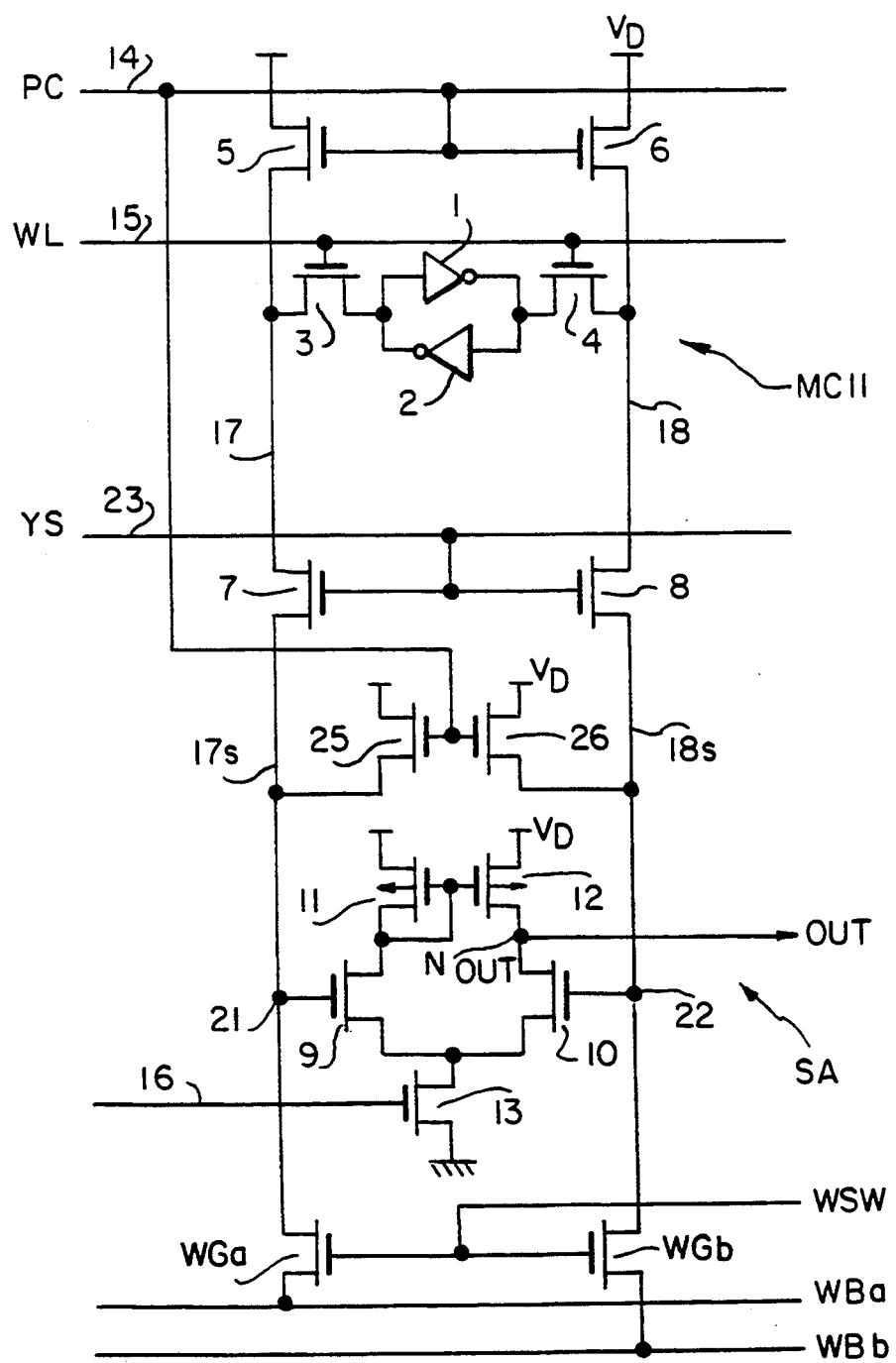
FIG. 6 shows an example of conventional semiconductor memory circuits.
Figure 7:
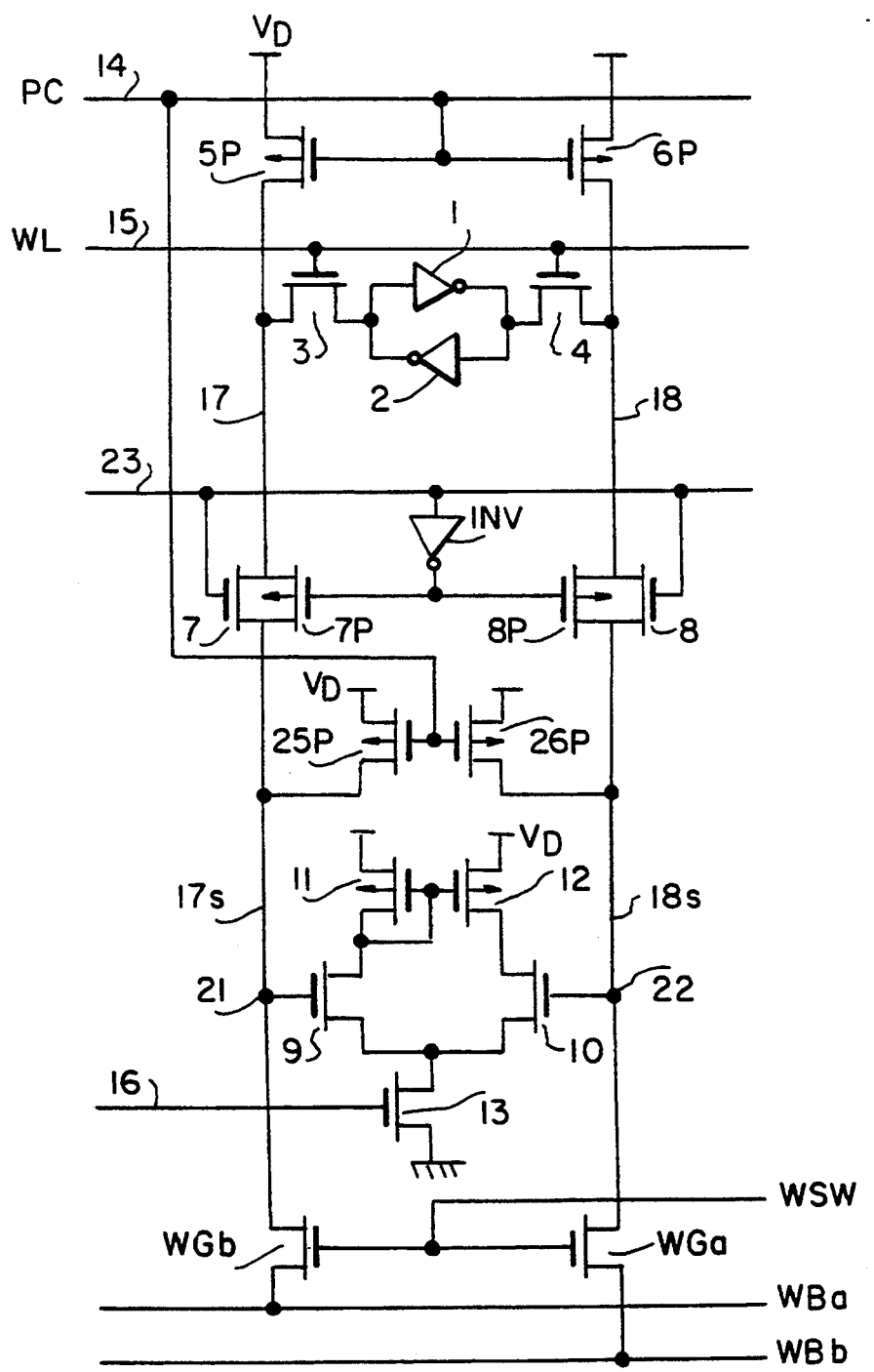
FIG. 7 shows another example of conventional semiconductor memory circuits.

FIG. 2 is a circuit diagram illustrating a part of the memory device of this embodiment, wherein equivalent parts to those in FIGS. 6 are designated by reference numerals and identical symbols to omit further description thereof. According to this embodiment, P-channel MOS type precharge transistors 19, 20 are provided for precharging the data lines 17s, 18s and the input nodes 21 and 22 of the sense amplifier SA up to the power supply voltage $V_D$, which is about 3 V, whereas the precharge transistors 5, 6 are formed by N-channel MOS type transistors for precharging the complementary data lines 17, 18 to the voltage $V_D$-$V_t$, wherein the voltage $V_t$ is a threshold voltage of each N-channel transistor and about 1.5 V. The transistors 3, 4 in the memory cell MC11, the column selection transistors 7, 8, the transistors 9, 10, 13 in the sense amplifier SA and the write gate transistors WGa, WGb are also formed by using N-channel transistors.

The read operation of this device will be described with reference to FIG. 3. Note that the set of address signals Add designates the memory cell MC11. The precharge control signal PC on the precharge line 14 is preliminary at high level and the bit lines 17 and 18 are precharged by the transistors 5, 6 to $V_D$-$V_t$. The sensing control signal SC on the control line 16 is at low level at this time so that the complementary signal lines 17s, 18s and the input nodes 21, 22 of the sense amplifier SA are precharged by the transistors 19, 20 up to the power supply voltage $V_D$. Subsequently, at the beginning of a read operation, the precharge control signal PC goes to the low level to stop the precharge operation on the bit lines 17, 18. At the same time, the control signal SC goes to the high level so that the precharge operation for the signal lines 17s, 18s and the nodes 21, 22 is also completed. Moreover, the column selection signal YS on the control line 23 is activated to the high level according to the address signal Add. The transistors 7, 8 are thereby turned on to connect the bit line pair 17, 18 to the data lines 17s, 18s, respectively. In this state, the precharge level of the bit lines 17, 18 and that of the data lines 17s, 18s are different from each other, that is, the former is $V_D$-$V_t$ and the latter is $V_D$, respectively. However, since the transistors 7, 8 are of an N-channel type and supplied at the gates thereof with the high level voltage of the control signal SC, which is the power supply voltage $V_D$, charge movement from the data lines 17s, 18s to the bit lines 17, 18 does not occur so that the respective precharging levels are maintained.

Subsequently, the word line 15 is activated and energized to the high level according to the address signal Add so that the memory cells MC11 is connected to the bit lines 17, 18 via the transistors 3, 4. The following description will be given under the condition where the memory cell MC11 stores data "0" so that the node N1 connected to the transistor 3, is at the low level voltage VS and the node N2 connected to the transistor 4 is at the high level voltage $V_D$. In this case, one end of the transfer gate transistor 4, which is the node N2, is at $V_D$ and the other end thereof, which is the data line 18, is at $V_D$-$V_t$. Accordingly, there will occur no charge movement from the node N2 to the data line 18 via the transistor 4 since the gate voltage of the transistor 4 is at the $V_D$ level and the transistor 4 has the threshold voltage $V_t$. The precharging voltage $V_D$-$V_t$ of the bit line 18 is thus maintained and the precharge level of the data line 18s (the input node 22 of the sense amplifier SA) is also maintained.

In contrast, since the node N1 within the memory cell MC11 is at the ground voltage VS, the current from the bit line 17 flows to the ground line via the transfer transistor 3 and the N-channel transistor 2TN of the inverter 2, that is, the memory cell MC11 starts to discharge the bit line 17 as well as the data line 17s through the transistor 7. At this time, however, the data line 17s is precharged up to the $V_D$ level, the precharge voltage $V_D$-$V_t$ of the bit line 17 is substantially maintained at the precharge voltage $V_D$-$V_t$ until the voltage of the data line 17s (end of the input node 21 of the sense amplifier SA) becomes equal to the voltage level $V_D$-$V_t$. In other words, when the word signal WL of the word line 15 starts to rise and the inverter 2 within the memory cell MC11 draws the charge on the data line 17, the charges on the data line 17s replenishes the bit line 17 via the transistor 7 and, therefore, only the voltage of the signal line 17s and the node 21 is decreased. The voltage of the data line 17 does not change substantially from the precharged voltage. This period is called, hereinafter, a first read period and indicated as T1 in FIG. 3.

During this period T1, the voltage variation dV/dT caused on the data line 17s (the node 21) per unit time is determined by the stray capacitance Csb of the data line 17s and the driving ability of the memory cell MC11 which is represented by the ON-current In flowing through the transistors 3 and 2TN. That is, the voltage variation dV/dt is as follows:

$$dV/dt = In/Csb.$$

When the voltage of the signal line 17s (the input node 21 of the sense amplifier SA) goes down to be equal to the voltage of the data line 17, that is the end of the period T1, the transistor 2TN starts to discharge both the bit line 17 and the data line 17s. A second read period T2 thereby starts from this point as shown in FIG. 3. Therefore, during the second read period, the voltage variation dV/dt of the signal line 17s (the input node 21 of the sense amplifier SA) per unit time is given as follows:

$$dV/dt = In/(Cb + Csb),$$

wherein the Cb represents the stray capacitance of the bit line 17.

Figure 3:
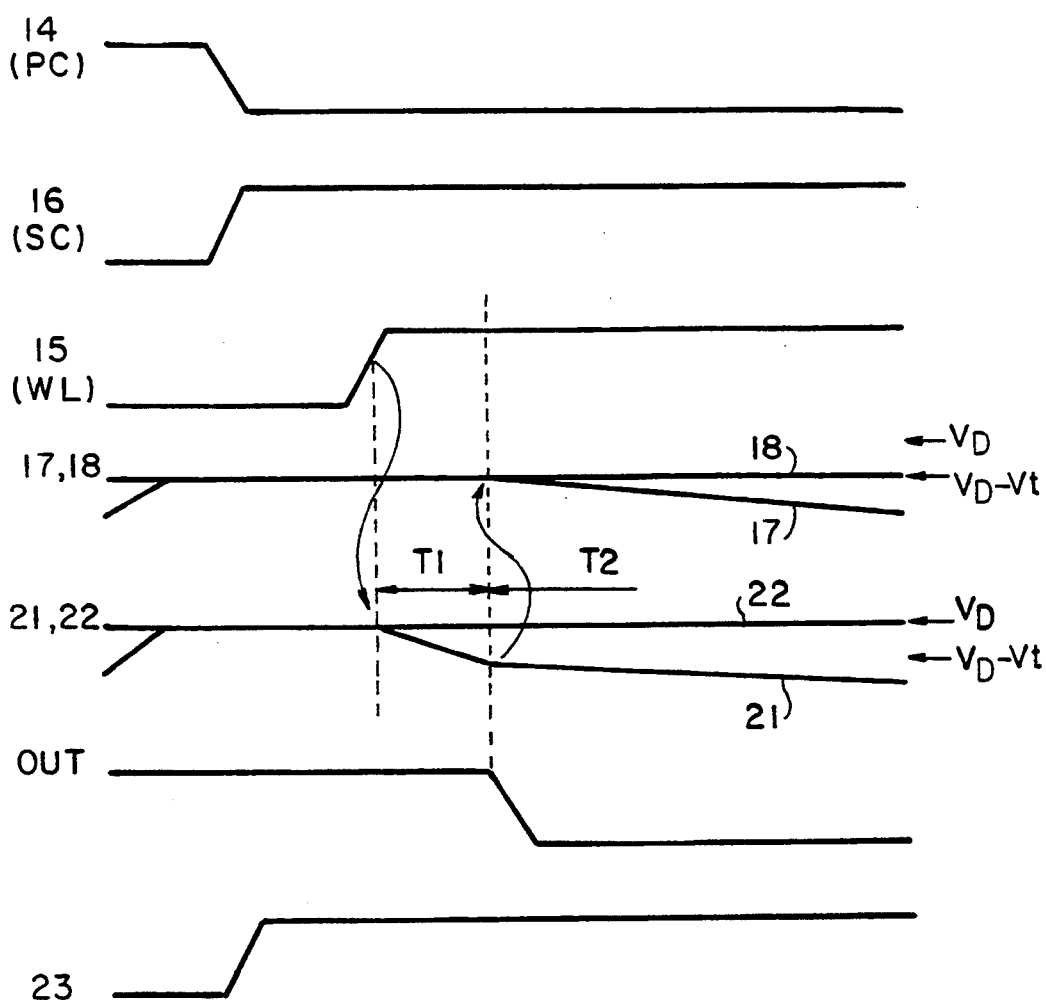
FIG. 3 is a timing chart in a data read mode of the circuit shown in FIG. 2.

Accordingly, the voltage level of the input node 21 of the sense amplifier SA is decreased with the inclination In/Csb during the period T1 from the voltage $V_D$ and with the inclination In/(Cb+Csb) during the period T2 as shown in FIG. 3, whereas the voltage level of the data line 17 is not changed during the period T1 and decreased only after the period T1, that is during the period T2, from the precharge voltage $V_D$-$V_t$ with the inclination In/(Cb+Csb).

For the sense amplifier SA, on the other hand, it is required to supply between the input nodes 21, 22 thereof a voltage difference above, about 0.5 to 1 V to make the sense amplifies SA sense and amplify the input voltage difference. The voltage of the input node 21 of the sense amplifier SA falls to the voltage $V_D$-$V_t$ at the end of the first read period T1, making the input voltage difference of the sense amplifier SA as large as the voltage $V_t$. Therefore, it is sufficient for the sense amplifier SA to sense the input potential difference and output the read data OUT from the output node Nout at the time near to the end of the period T1 or, at least, immediately after the period T1. From a theoretical point or view, with assumption that the voltage difference Vsen is smaller than the voltage Vt as mentioned above and the voltage variation dV/dt is constant in the read period T1, the time Tsen needed for the sense amplifier SA to sense the read data is as follows:

$$Tsen = Vsen/(dV/dt)$$
$$= (Vsen*Csb)/In.$$

It is apparent, in this device, that the stored data in the memory cell MC11 substantially reflects only on the voltage of the data line 17s (the input node 21 of the sense amplifier SA), so that the data transfer speed is substantially independent from the capacitance Cb of the bit line 17 which is very large because of its length and the large number of the memory cells MC11 being connected thereto. The capacitance Csb of the data line 17s is very small owing to the minute size thereof, the read operation is achieved at considerably high speed. On the other hand, in a case where the data is transferred as a voltage decrease of the data line 17 the read operation time as large as (Vsen*(Csb+Cb))/In is needed. That is, the operating speed in a read operation according to this memory device is as several tens or a hundred times as high as in case of conventional ones.

Moreover, since the precharging level of the input nodes 21, 22 of the sense amplifier SA is the power supply voltage $V_D$, there is no decline in the sensing ability of the sense amplifier SA even under the condition where the lower power supply voltage such as 2.5 or 2 V is provided. Furthermore, since the precharging level of the bit lines 17, 18 is the voltage $V_D$-$V_t$, the power consumption of the precharging operation can be reduced and there is no possibility of deterioration in the holding ability of the memory cells MC11 to store the low level voltage as a memory data, that is, the holding margin of the memory cells MC11 is highly increased.

Figure 4:
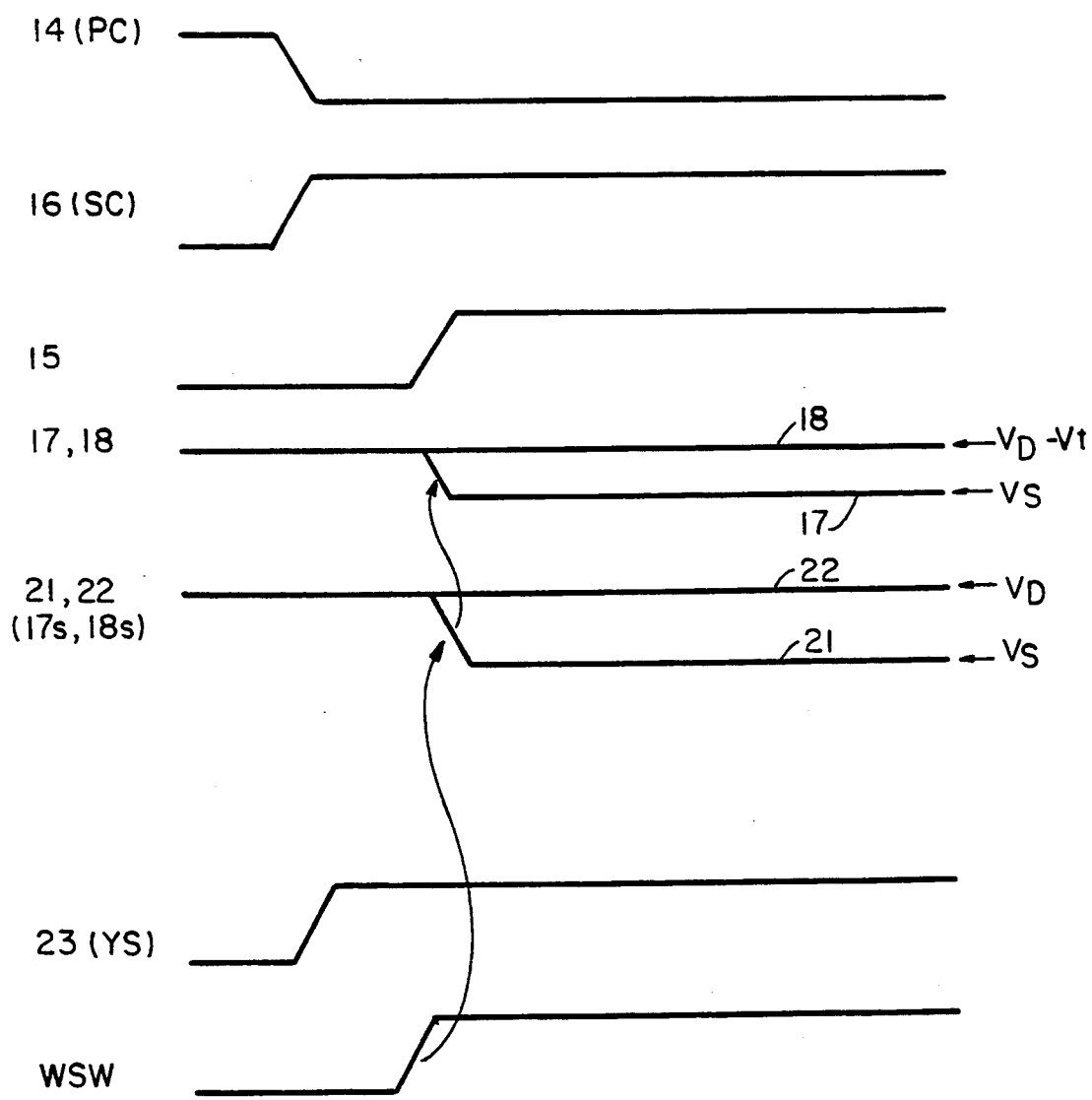
FIG. 4 is a timing chart in a data write mode of the circuit shown in FIG. 3.

The write operation will be explained below with reference to FIG. 4. The precharge control signal PC on the precharge line 14 is preliminary at high level and the bit lines 17, 18 are precharged to the voltage $V_D$-$V_t$. The sensing control signal SC is at low level and the data lines 17s, 18s and the input nodes 21, 22 of the sense amplifier SA are precharged to the power supply voltage $V_D$. Subsequently, the signals PC and SC are changed to the low level and the high level, respectively, to terminate the precharge operation of the respective lines 17, 18, 17s and 18s. The column selection signal YS on the line 23 is then activated to the high level so that the bit lines 17, 18 and the data lines 17s, 18s are connected to each other, respectively. In this state, as the same as the read operation, the precharge levels of the complementary data lines 17, 18 and the signal lines 17s, 18s, which are $V_D$-$V_t$ and $V_D$, respectively, are maintained owing to the transistors 7, 8. Then, the word line 15 is activated and the memory cell MC11 is thereby connected to the bit lines 17, 18. At the same time, the write control signal line WSW is activated to the high level, so that the true and complementary write data signals indicative of data to be written are transferred via the write data lines WBa, WBb and the write control gate transistors WGa, WGb to the data lines 17s, 18s. Thus, one of the data lines 17s and 18s and one of the bit lines 17 and 18 are discharged to the ground voltage VS, whereas the other data line and the other bit line 17 are maintained at the precharged voltage levels $V_D$ and $V_D$-$V_t$, respectively. The desired data is thus written into the cell MC11.

Since the signal line 17s has a very small capacitance Csb as mentioned above so that the power consumption for precharging and discharging the signal line 17s is also very small. Moreover, the data line 17 is precharged only up to the voltage $V_D$- $V_t$ which is sufficient to restrain the power consumption within a small amount. That is, when the power supply voltage $V_D$ is at 3 V and the threshold voltage $V_t$ is at 1.5 V as mentioned above, power consumption according to this embodiment is only half as in the case where the data lines 17, 18 are precharged to the voltage $V_D$.

Figure 5:
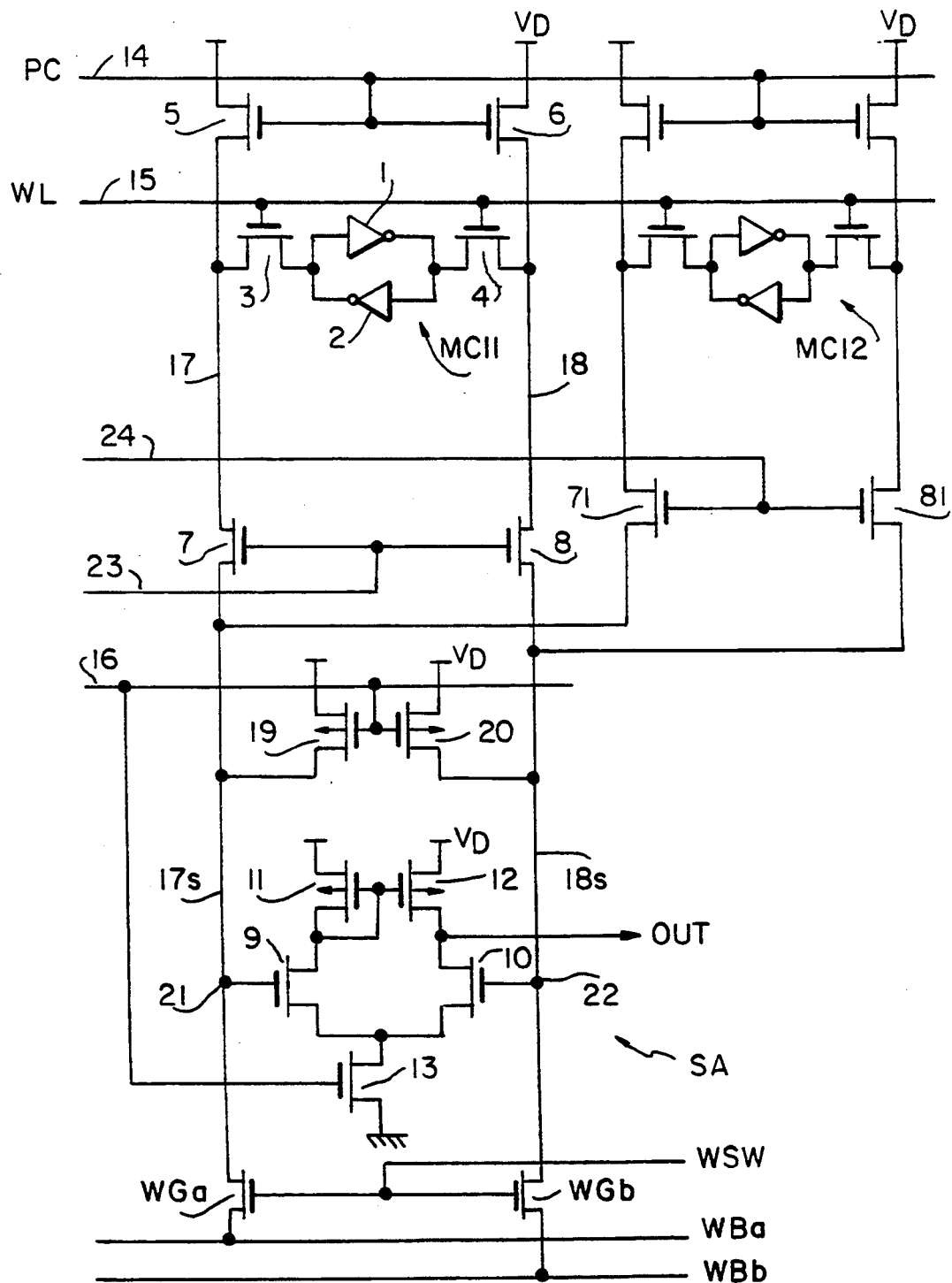
FIG. 5 is a circuit configuration of a device of another embodiment of the present invention.

Turning to FIG. 5, a memory device of another embodiment of this invention, where parts equivalent to those in FIG. 2 are labeled with identical symbols, corresponds to a case where a memory device has a plurality of columns of complementary data line pairs 17 and 18 associated with a single pair of the data lines 17s, 18s and a sense amplifier SA. FIG. 5 shows a circuit configuration where two columns of the data lines 17, 18 are provided. The transistors 7, 8 and 71, 81 are selectively activated by a column selection signal on the lines 23, 24 so that a desired column of complementary data line pair is selected according to the addess signal Add. In this device, each complementary data line pair 17 and 18 is precharged to the voltage $V_D$-$V_t$ by the N-channel MOS transistors 5, 6 and the signal lines 17s, 18s and the input nodes 21, 22 of the sense amplifier SA are precharged to the voltage $V_D$ by the P-channel MOS transistors 11, 12. This device also achieves the high speed operation even under the condition of a low power supply voltage and has small power consumption and a large holding margin.

Although the case of two columns is described in FIG. 5, this invention is applicable to the case of multiple columns as described above and, moreover, although a memory device having one port is discussed, the present invention is also applicable to each port for a memory device having a plurality of input/output ports.

Furthermore, the circuit configuration of the device according to the invention can be improved in such a manner that the sense amplifier SA is deactivated and the data lines 17, 18 and the signal lines 17s, 18s are precharged immediately after the first read period T1 so as to reduce the power consumption more effectively.

What is claimed is:

1. A semiconductor memory device comprising a plurality of word lines, a plurality of pairs of bit lines, a plurality of memory cells each disposed at one of intersections of said word lines and said pairs of bit lines, a pair of data lines, a sense amplifier coupled to said pair of data lines, a plurality of pairs of transfer gate transistors each pair coupled between said pair of data lines and an associated one of said pairs of bit lines, first precharge means for precharging said pairs of bit lines to a first voltage and second precharge means for precharging said pair of data lines to a second voltage larger in absolute value than said first voltage.

2. The device and claimed in claim 1, wherein said second voltage is larger than said first voltage by a threshold voltage of said transfer gate transistors and said transfer gate transistors have gate electrodes thereof supplied, when selected, with said second voltage.

3. The device as claimed in claim 2, wherein each of said transfer gate transistors is of a first conductivity type, said first precharge means including a first MOS transistor of said first conductivity type and said second precharge means including a second MOS transistor of a second conductivity type.

4. The device as claimed in claim 3, wherein said first conductivity type is an N-channel type and said second conductivity type is of a P-channel type.

5. The device as claimed in claim 3, wherein each of said memory cells includes a pair of cell gate transistors of said first conductivity type coupled respectively to said pair of bit lines.

6. The device as claimed in claim 2, wherein said sense amplifier includes a pair of input transistors which have gate electrodes connected respectively to said pair of data lines and has said first conductivity type.

7. A semiconductor memory device comprising at least one bit line, means for coupling a selected one of memory cells to said bit line, a data line, a sense amplifier coupled to said data line, transfer gate means operatively coupling said bit line to said data line, first precharge means for precharging said bit line to a first voltage, and second precharge means for precharging said data line to a second voltage higher than said first voltage.

8. The device as claimed in claim 7, wherein said transfer gate means comprises a first MOS transistor and said first and second precharge means include a second and a third MOS transistor, respectively, each of said first and second MOS transistors being of a first channel type and said third MOS transistor being of a second channel type.

9. A semiconductor memory device comprising a plurality of word lines, a plurality of pairs of bit lines, a plurality of memory cells each disposed at an associated one of intersections of said word lines and said pairs of bit lines, a pair of data lines, a plurality of pairs of first MOS transistors of one channel type each pair inserted between said pair of data lines and an associated one of said pairs of bit lines, a plurality of pairs of second MOS transistors of said one channel type each pair inserted between a power supply line and an associated one of said pair of bit lines, a pair of third MOS transistors of an opposite channel type inserted between said power supply line and said pair of data lines, a sense amplifier coupled to said pair of data lines, and circuit means for rendering each of said second and third MOS transistors conductive and each of said first MOS transistors non-conductive during a precharge operation to thereby precharge each of said pairs of bit lines to a first precharge level and said pair of data lines to a second precharge level that is higher than said first precharge level and for rendering each of said second and third MOS transistors non-conductive and a selected one of said pairs of first MOS transistors conductive during a data read operation to thereby electrically connect one of said pairs of bit lines to said pair of data lines.

10. The memory device as claimed in claim 9, wherein said one channel type is an N-channel type and said opposite channel type is a P-channel type.

* * * * *